United States Patent [19]

Francis

[11] Patent Number: 5,541,556
[45] Date of Patent: Jul. 30, 1996

[54] CLOCK RECOVERY CIRCUIT FOR SERIAL DIGITAL VIDEO

[75] Inventor: John R. Francis, Burlington, Canada

[73] Assignee: Gennum Corporation, Burlington, Canada

[21] Appl. No.: 360,544

[22] Filed: Dec. 21, 1994

[51] Int. Cl.⁶ ..................................................... H03L 7/12
[52] U.S. Cl. .................. 331/4; 331/1 A; 331/20; 348/543
[58] Field of Search ................................. 331/4, 1 A, 20; 348/542, 543, 544

[56] References Cited

U.S. PATENT DOCUMENTS 5,473,639  12/1995  Lee et al. ..................................... 331/4

OTHER PUBLICATIONS

S. Webster, E. Fankhauser, K. Chen, J. Francis, E. Ioszef, T. Rosati, I. Ridpath, and P. Moore, "A New Chip Set for Proposed SMPTE Standard SMPTE 259M—Serial Digital Interface", *SMPTE Journal*, Sep. 1993, pp. 777–785.

*Primary Examiner*—Siegfried H. Grimm
*Attorney, Agent, or Firm*—Bereskin & Parr

[57] ABSTRACT

A control circuit for use with a phase locked loop in a digital video receiver. The digital receiver accepts a serial digital input signal which can comprise composite or component video signals. The phase locked loop comprises a phase detector, a loop filter, and a voltage controlled oscillator (VCO) and includes a divide-by-two modulus divider coupled to the output of the VCO. The VCO has an oscillation frequency control port and the divider has a frequency select port. The control circuit includes an automatic fine tuning and frequency sweeping stage which is coupled to the output of the loop filter and the oscillation frequency control port. The tuning and frequency stage provides temperature drift correction for the VCO. In addition, the tuning and frequency stage "sweeps" the oscillation frequency of the VCO to aid in "locking" the phase locked loop to the phase or frequency of the input signal. Once locked, timing signals and digital data can be extracted from the input signal. The control circuit also includes a video signal detector stage for detecting whether the input signal comprises a composite video signal or a component video signal. The video signal detector stage produces an output signal which controls the modulus of the divider in the phase locked loop.

5 Claims, 5 Drawing Sheets

1
CLOCK RECOVERY CIRCUIT FOR SERIAL DIGITAL VIDEO

FIELD OF THE INVENTION

The present invention relates to a clock recovery circuit for serial digital video. More particularly, the present invention relates to a control circuit which is suitable for fabrication as an integrated circuit for extracting the clock and re-timing the data of serial digital video in a system having a phase lock loop circuit, a descrambler and a deserializer for serial digital signals.

BACKGROUND OF THE INVENTION

There are various known methods for representing serial digital data. For example, serial digital data can be represented as a polarity-free scrambled NRZI (Non-Return-to-Zero-Inversion) sequence generated with two fixed polynomials implemented as linear feedback shift registers. There are also SMPTE standards describing bit-parallel digital interfaces for various analog signals and serial digital interfaces for these bit-parallel digital signals. Subsequently, there are a multitude of systems which use various serial digital video signals having differing data rates. For example, in analog video signals, the timing information will depend on the horizontal line frequency, which is typically controlled by a timing signal known as the horizontal sync. In the NTSC video standard, the composite video signal has 525 horizontal lines every frame with 29.97 frames per second, so that the resultant horizontal line frequency is 15.734 kHz. In the PAL video standard, the composite video signal has 625 horizontal lines every frame with 25 frames per second, resulting in a horizontal line frequency of 15.625 kHz. For composite video, one timing reference signal (TRS) per horizontal line is present in the digital signal to identify the horizontal sync timing signal. On the other hand, a component video signal (in the form of one luminance and two colour-difference components) will have two timing reference signals per horizontal line in digital signal, although the component video will have the same line frequency as its composite counterpart. The two TRS's identify the end-of-active-video (EAV) and the start-of-active-video (SAV) timing references.

According to the known SMPTE (Society of Motion Picture and Television Engineers) 259M standard, the bit rates of the serial digital signals for the above horizontal rates are defined with either 4:2:2 component or 4 $f_{sc}$ composite digital signals. The component signals have the same bit rates for either the 525 or 625 line systems, and have a 270 megabit/second bit rate for 13.5 MHz luminance sampling and 360 megabit/second for 18 MHz luminance sampling. For the composite video signals, the bit rate for composite NTSC 4 $f_{sc}$ signals is 143 megabits/second and for composite PAL 4 $f_{sc}$ signals is 177.3 megabits/second.

A phase lock loop (PLL) is a known circuit which is used in data communication receivers to lock the phase of a voltage-controlled oscillator (VCO) to the incoming data stream and thereby recover the clock signal from the data. The clock signal is subsequently used to sample the incoming data in order to generate a new data signal which has been re-timed or synchronized with the recovered clock signal. Since the clock signal is derived from the voltage controlled oscillator, both the recovered clock and the re-timed data are relatively free from "timing jitter". The data and clock signals are then fed into a descrambler. Descramblers are used to transform and decode the scrambled serial digital stream into the original unscrambled serial data stream. The unscrambled data stream is then shifted into a deserializer which converts serial data into parallel data (e.g. ten-bit). The deserializer detects the timing reference signal (TRS) in order to set the ten-bit word boundary for the parallel outputs.

It will be appreciated that where a system is designed to be capable of extracting the clock signal from various digital video data streams having a range of bit rates, the voltage controlled oscillator must have a wide tuning range. Unfortunately, a wide tuning range can lead to the VCO locking to a harmonic and thereby result in an incorrect clock signal. In addition, in systems where the exact bit rate is not known but is within a set of given bit rates, it is desirable to know at which bit rate the phase locked loop has locked. To avoid locking on a harmonic and to determine the bit rate at which the phase lock loop has locked, known voltage controlled oscillators are typically designed to have a narrow tuning range with selectable center frequencies that are appropriate for given serial digital bit rates. To avoid the possibility of locking to a harmonic when the center frequency is automatically selected, the system will include a descrambler and deserializer to detect the timing reference signal in order to indicate whether the extracted clock signal and re-timed data are valid or invalid. In these known systems, if a timing reference signal is detected, it follows that the desired center frequency setting for the voltage controlled oscillator has been selected. If the timing reference signal has not been detected after an appropriate amount of time, a different center frequency setting is selected and this process is repeated until the timing reference signal is detected.

One of the problems with these prior art systems is that it is difficult for a voltage controlled oscillator to maintain low phase noise over a wide range of oscillation frequencies. One known approach to this problem involves reducing the range a voltage controlled oscillator is required to be tuned by inserting a dual modulus frequency divider in the feedback loop of the phase lock loop. The modulus for the dual frequency divider is selected to be one or two. Thus, for a given input to the phase lock loop, the voltage controlled oscillator frequency will be two times higher when a divider modulus is two than when it is one. In such a system, the clock is now derived from the output of the divider, and hence not affected by the divider modulus selection.

The process of bringing a phase locked loop into lock is termed acquisition, or if the loop acquires lock by itself then it is termed pull-in. It is known that this ability to lock is limited by the loop band width and often only achievable in practical systems with some assistance. One known method which is used to assist in locking a phase locked loop is known as frequency sweeping method. Frequency sweeping uses auxiliary circuits to reliably achieve lock. A typical frequency sweep circuit comprises a constant current which is fed into the integrator of the loop filter. The output is a ramp which is used to control the voltage controlled oscillator, thereby sweeping the voltage controlled oscillator frequency. Once the phase locked loop has acquired lock, the current is shut off and the integrator has been charged to the correct voltage needed by the voltage controlled oscillator.

Another problem with phase locked loop circuits for digital serial applications arises from the temperature dependence, i.e. drift, of the voltage controlled oscillator. In practical systems, the voltage controlled oscillator can have a relatively large temperature dependence. For a phase locked loop with a wide tuning range, temperature drift is normally not a problem because it can be compensated by the feedback loop. However, in phase locked loops having a narrow tuning range, i.e. for serial digital applications, the temperature dependence of the voltage controlled oscillator can be outside the loop adjustment range. Therefore, the ability of the phase locked loop to correct for temperature drifts in the voltage controlled oscillator can be greatly limited and temperature dependence becomes a problem because it can affect performance of the phase locked loop and digital receiver.

Accordingly, there is a need for a control circuit for use with a phase locked loop in a digital receiver which can provide automatic fine tuning and aided acquisition for the phase locked loop stage. The automatic fine tuning circuit should have a low time constant so that there is little or no effect on the characteristics of the phase locked loop. Furthermore, in a digital video application, there is a need to have a clock recovery system which can differentiate between composite video and component video.

BRIEF SUMMARY OF THE INVENTION

The present invention provides a control circuit for use with a phase locked loop having an input port for an input signal and a voltage controlled oscillator which includes a frequency divider having a frequency select input port for selecting the modulus and the voltage controlled oscillator having a control port for controlling the frequency of the voltage controlled oscillator, said control circuit comprising: (a) a tuning stage coupled to the control port of the voltage controlled oscillator, said tuning stage including means for producing a frequency control signal at said control port for controlling the frequency of the voltage controlled oscillator (b) a frequency sweeping stage coupled to said tuning stage and including means for varying the frequency of the voltage controlled oscillator and means for locking the frequency of the voltage controlled oscillator to the input signal; and (c) a control stage coupled to said frequency sweeping stage and having an input for receiving a timing reference signal derived from the input signal and means responsive to said timing reference signal for controlling the operation of said frequency sweeping stage and said tuning stage.

In another aspect, the present invention provides a composite and component video detector circuit for use with a digital video receiver having an input for receiving a serial digital input signal and including a phase locked loop having a voltage controlled oscillator with a frequency divider stage for locking to the phase of the serial digital signal, the frequency divider stage including a frequency select input port for controlling the modulus of the divider, and the serial digital input signal comprising a composite video signal or a component video signal, said circuit comprising: (a) input port means for receiving a timing reference signal derived from said serial digital input signal; (b) frequency detector means coupled to said input port means for producing a signal indicative of the frequency of said timing reference signal and discriminator means responsive to said signal for discriminating a composite video signal from a component video signal; and (c) modulus control means coupled to said discriminator means for producing a frequency select signal on an output coupled to the frequency select input port of the frequency divider.

The control circuit according to the present invention features an automatic fine tuning and frequency sweeping for controlling the voltage controlled oscillator in a phase locked loop.

The control circuit according to the invention also features a detection stage for detecting composite and component video signals.

BRIEF DESCRIPTION OF THE DRAWINGS

For a better understanding of the present invention, and to show more clearly how it may be carried into effect, reference will now be made, by way of example, to the accompanying drawings which show preferred embodiments of the present invention, and in which.

DETAILED DESCRIPTION OF THE PREFERRED EMBODIMENTS

Figure 1:
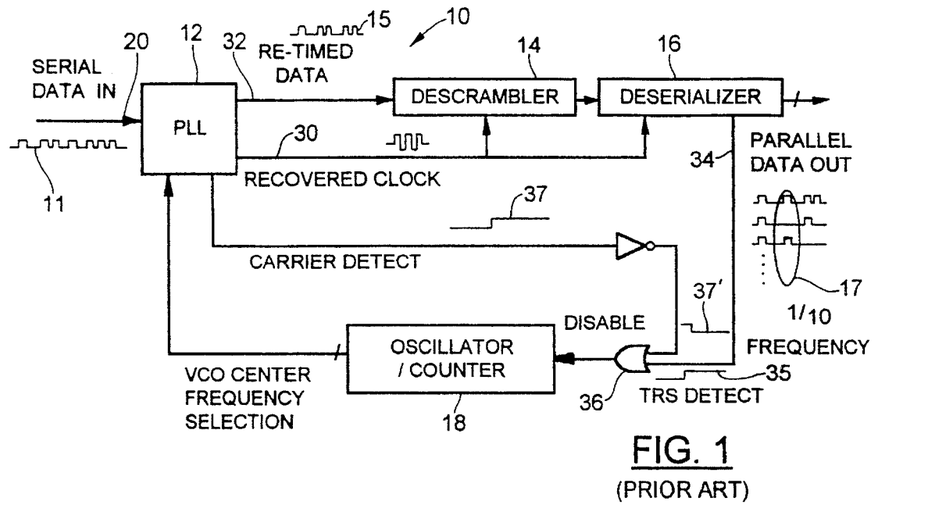
FIG. 1 is a block diagram showing a known automatic clock recovery circuit for use with serial digital video.

Reference is first made to FIG. 1 which shows an automatic clock recovery circuit 10 according to the prior art, and suitable for use with a serial digital signal 11, e.g. a video signal. The automatic clock recovery circuit 10 comprises a phase locked loop 12, a descrambler 14, a deserializer 16, and an oscillator/counter 18. As will be described, the phase locked loop 12 is used to lock the phase of the serial digital signal 11 and recover a clock signal 13. The clock signal 13 is used to produce a re-timed data signal 15 which is synchronized with the recovered clock signal 13. The descrambler 14 uses the recovered clock signal 13 to descramble (or transform) the data signal 15 to a serial stream comprising the original unscrambled data. The unscrambled serial data is then fed to the deserializer 16 which converts it into parallel data, e.g. 10-bit data words.

In the following description, the serial digital signal 11 will comprise a digital video signal. For example, the digital video signal can be defined according standards set by the Society of Motion Picture and Television Engineers (SMPTE). The SMPTE 259M standard defines the bit rates for serial digital signals for "composite" video and "component" video systems. Composite video systems include the known NTSC standard and the known PAL standard. According to the NTSC standard, a composite video signal has 525 horizontal lines every frame with 29.97 frames per second to yield a horizontal line frequency of 15.734 kilohertz (kHz). The PAL composite video signal has 625 lines in each frame with 25 frames per second to give a horizontal line frequency of 15.625 kHz. In digital form, the composite video signal, i.e. serial digital signal 11, will have one timing reference signal (TRS) per horizontal line. The serial digital signal 11 comprises a stream of digital data, e.g. bits, and the TRS corresponds to the horizontal sync pulse and identifies a horizontal line. In other words, the TRS provides timing and synchronization information associated with the serial digital signal 11.

In a component video system, the video signal includes a luminance signal component and two chrominance signal components. Because luminance and chrominance are separately encoded, the colour can be changed independently of the luminance in a component system. The component video signal has the same line frequency as its composite counterpart, e.g. 15.734 kHz for the NTSC standard and 15.625 kHz for PAL. However, in a component video signal there are two timing reference signals (TRS) present in the corresponding serial digital signal 11. One TRS identifies "end-of-active-video or EAV and the other TRS identifies "start-of-active-video" or SAV, as will be understood by those skilled in the art.

The SMPTE 259M standard defines the bit rates for the serial digital video signals for the NTSC and PAL standards with either 4 $f_{sc}$ composite digital signals or 4:2:2 component digital signals. The bit rate for composite NTSC 4 $f_{sc}$ signals is 143 Mega-bits/second (Mb/s) and for composite PAL 4 $f_{sc}$ signals, the bit rate is 177.3 Mb/s. For component video signals, the bit rates are the same for NTSC (525 line) and PAL (625 line) systems, and according to the SMPTE 259M standard are 270 Mb/s for 13.5 MHz luminance sampling and 360 Mb/s for 18 MHz luminance sampling.

Figure 2:
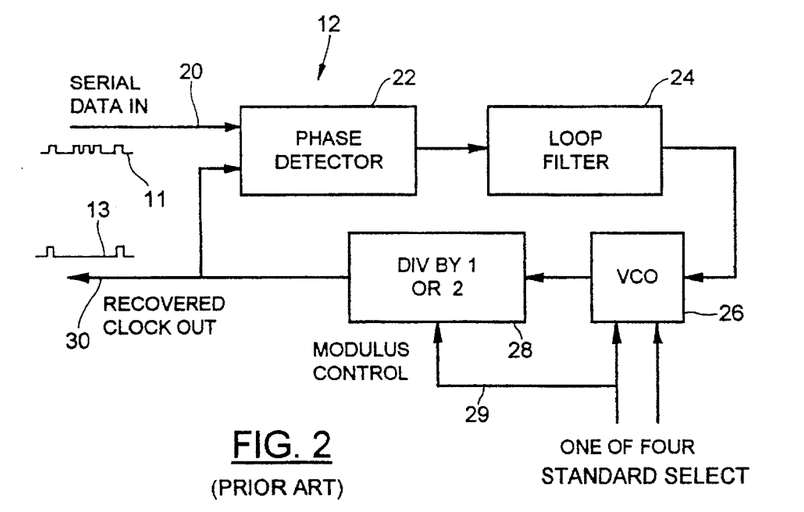
FIG. 2 shows in block diagram form a phase locked loop having a dual modulus divider according to the prior art.

Referring to both FIGS. 1 and 2, the phase locked loop 12 has an input 20 for receiving the serial digital signal 11. The phase locked loop 12 is a "frequency-selective" circuit which includes a phase detector 22, a loop filter 24 and a voltage controlled oscillator or VCO 26 as shown in FIG. 2. The VCO 26 is connected to the output of the loop filter 24 and the input of the phase detector 22 to form a feedback system as will be understood by those skilled in the art. As shown in FIG. 2, the feedback loop can include a dual modulus divider 28. The dual modulus divider 28 extends the range of the VCO 26 as will be described below. The dual modulus divider 28 has an output line 30 for the recovered clock signal 13.

The phase locked loop 12 uses the VCO 26 to lock to the phase of the incoming serial digital signal 11 and thereby recover the clock signal which is embedded in the serial data bits comprising the digital signal 11. The recovered clock signal 13 is subsequently used to sample the incoming serial digital signal 11 to generate the re-timed digital signal 15 which is synchronized with the recovered clock 13. Since the clock signal 13 is derived from the output of the VCO 26, both the recovered clock 13 and the re-timed digital signal 15 will be relatively free of "jitter".

As shown in FIG. 1, the clock output 30 from the phase locked loop 12 is coupled to the descrambler 14 and the deserializer 16. The phase locked loop 12 also includes an output 32 for the re-timed digital signal 15 which is fed to the descrambler 14. The primary function of the descrambler 14 is to transform or decode the data bits in the re-timed digital signal 13 into a form corresponding to the original unscrambled data. The decoded data bits are then shifted into the deserializer 16. The deserializer 16 converts the serial stream of descrambled data bits into a parallel data signal 17. The deserializer 16 detects the timing reference signal (TRS) and uses it with the recovered clock signal 13 to set the word boundaries, for example 10-bits, for converting the serial stream to parallel data 17. The deserializer 16 also has an output 34 for a TRS DETECT signal indicated by reference 35.

Referring still to FIG. 1, the oscillator/binary counter 18 controls the center frequency selection of the phase locked loop 12 by selecting the center frequency for the VCO 26 (FIG. 2). The oscillator/counter 18 generates a center frequency selection control signal for the VCO 26. The rate of center frequency selection is determined by the oscillator 18.

As shown in FIG. 1, the oscillator/counter 18 is also coupled to the output 34 for the TRS DETECT signal 35 from the deserializer 16. The TRS DETECT signal 35 goes high (i.e. becomes active) when the correct center frequency for the VCO 26 has been selected. Once the desired center frequency has been selected, the oscillator 18 is disabled. If the serial digital signal 11 is lost, the TRS DETECT signal 35 will go low (because the TRS signal (not shown) cannot be detected if there is no digital signal 11). A TRS DETECT signal 35, which is low, enables the oscillator 18 and causes the center frequency of the VCO 26 to change at a rate determined by the oscillator 18 until the VCO 26 "locks" to an input digital signal 11.

It will be appreciated that the center frequency setting for the VCO 26 is lost any time TRS DETECT signal 35 goes low. Thus, if the digital signal 11 is interrupted, the TRS DETECT signal 35 will also go low thereby causing the center frequency setting for the VCO 26 to be lost. To prevent this, a logic (OR) gate 36 having the TRS DETECT signal 35 as one input and an inverted CARRIER DETECT signal 37' as the other input provides the enable input for the oscillator 18. It will be understood that if the digital signal 11 is interrupted, the CARRIER DETECT 37' will go high. Thus, the oscillator 18 remains disabled when the TRS DETECT signal 35 goes low (since the inverted CARRIER DETECT signal 37' goes high), thereby preventing an interruption in the TRS DETECT signal 35 from enabling the oscillator 18 and loss of the center frequency setting for the VCO 26.

As shown in FIG. 2, the dual modulus divider 28 is coupled between the output of the VCO 26 and one of the inputs to the phase detector 22 in the feedback loop of the phase locked loop 12. With the dual modulus divider 28, the PLL 12 can have a wider range of oscillation frequencies while utilizing a VCO 26 with a narrow tuning range. This arrangement attempts to overcome one problem encountered with prior art systems. It is difficult for a voltage controlled oscillator to maintain low phase noise over a wide range of oscillation frequencies. Referring to FIG. 2, the dual modulus divider 28 is inserted into the feedback loop of the phase locked loop 12. The dual modulus divider 28 has a modulus which can be selected to be one or two. Therefore for a given input to the phase locked loop 12, the frequency of the VCO 26 will be two times higher when the modulus of the divider 28 is two than when the modulus is one. Therefore for the arrangement shown in FIG. 2, the recovered clock signal 13 is derived from the clock output 30 of the divider 28 and the modulus selection is transparent.

For the SMPTE 259M standard, the modulus of the divider 28 is set to 2 for composite NTSC 4 $f_{sc}$ signals (143 MB/S) and for composite PAL 4 $f_{sc}$ (177.3 MB/S). This brings the frequencies of the voltage controlled oscillator 26 within the range of that required for component signals, i.e. 270 MB/S for 18MHz luminance sampling. This, in turn, reduces the required tuning range of the voltage controlled oscillator 26 by a factor of 2.4. However, if four digital signal standards are being used, two bits will be required to select the center frequency for the voltage controlled oscillator 26. One of these bits is used as the divider modulus control (i.e. on input line 29) to define which two center frequencies of the voltage control oscillator 26 must be used for the 4 $f_{sc}$ composite digital signals and which two must be used for the 4:2:2 component digital signals.

The process of bringing a phase locked loop 12 into "lock" is known in the art as "acquisition". Alternatively, if the phase locked loop 12 can acquire lock by itself the term that is used is "pull-in". It is well known that the ability to "lock" is limited by the loop bandwidth of a phase locked loop 12, and in many cases is achievable only with some assistance.

Figure 3:
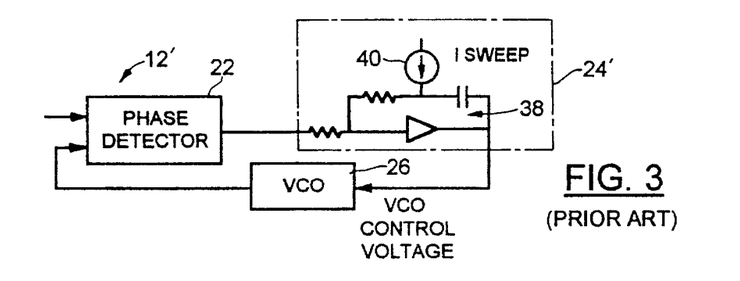
FIG. 3 is a block diagram showing a frequency sweeping circuit for assisting acquisition of lock in a phase locked loop according to the prior art.

FIG. 3 shows a phase locked loop 12' with a loop filter 24' which includes an auxiliary circuit for frequency sweeping. The loop filter 24' includes an integrator 38. The frequency sweep circuit comprises a constant current source 40 which feeds a current $I_{sweep}$ into the integrator 38 of the loop filter 24'. The output of the loop filter 24' is a ramp which is used to control the VCO 26, thereby sweeping the frequency of the VCO 26. Once the phase locked loop 12' has acquired lock, the current $I_{sweep}$ produced by the current source 40 is shut off and the integrator 38 will be charged to the correct voltage as needed by the VCO 26.

Figure 4:
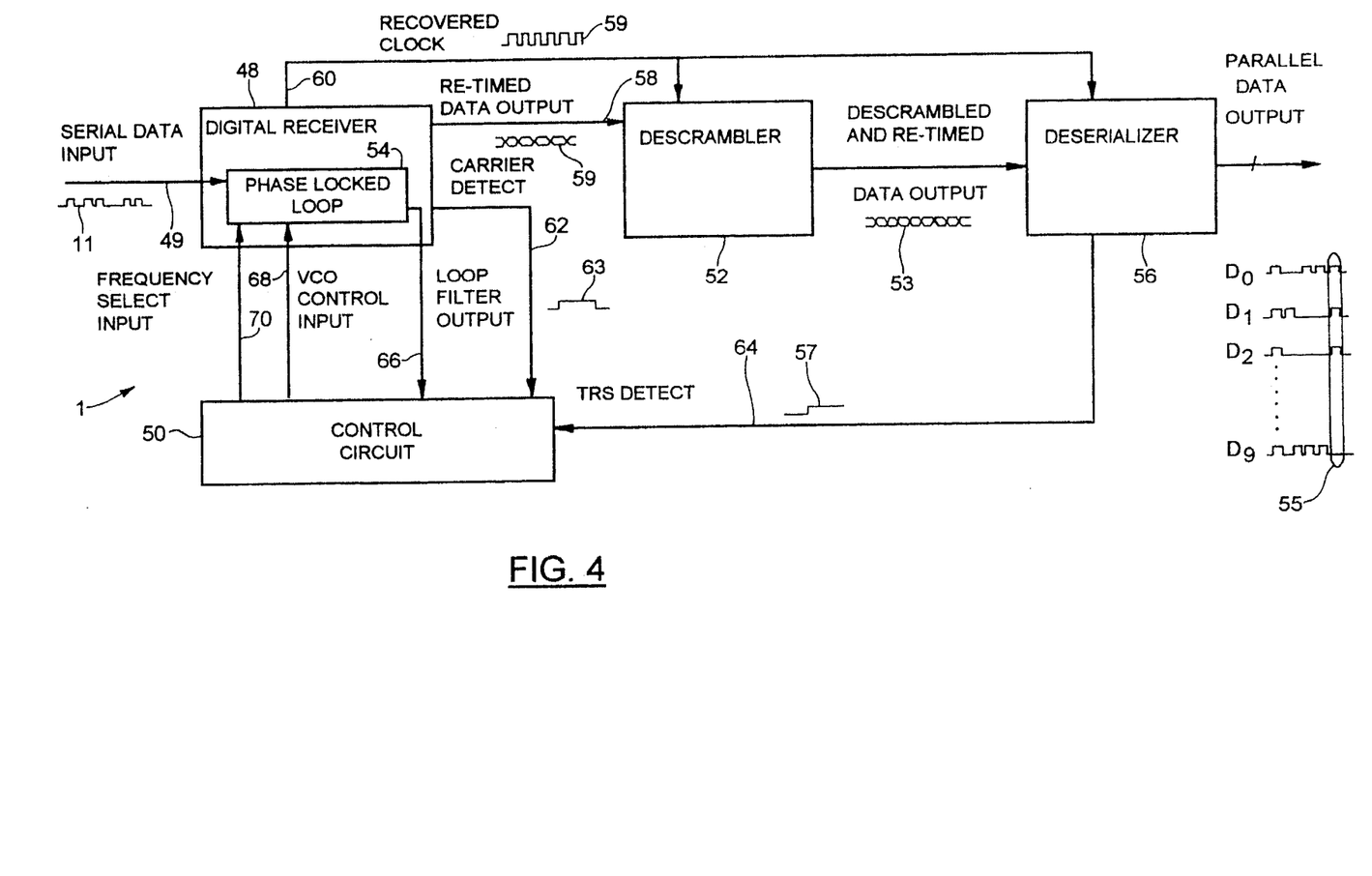
FIG. 4 is a block diagram showing a clock recovery circuit according to the present invention coupled to a digital receiver and descrambler for a video system.

Reference is next made to FIG. 4 which shows a control circuit 50 for use with a phase locked loop in a clock recovery circuit indicated generally by reference 1 according to the present invention. The clock recovery circuit 1 shown is suitable for a digital video application, for example, a digital video receiver according to the SMPTE 259M standard.

As shown in FIG. 4, the clock recovery circuit 1 comprises a digital receiver 48 coupled to a descrambler 52 which, in turn, is coupled to a deserializer 56. The digital receiver 48 has an input port 49 which receives the serial data input signal 11. The digital receiver 48 includes a phase locked loop 54 which is used to "lock" to the input signal 11. The phase locked loop 54 is typically integrated with the digital receiver 48 and coupled to signal processing circuitry (not shown) in the digital receiver 48. The signal processing circuitry uses the output from the phase locked loop 54 to produce a re-timed data signal 51 on output 58, a recovered clock signal 59 on output 60, and a carrier detect signal 63 on output 62.

The re-timed data 51 and recovered clock 59 signals are fed into the descrambler 52. The descrambler 52 transforms, i.e. "descrambles", the serial digital stream comprising the input signal 11 into its original unscrambled form, and produces a descrambled data output signal 53. The descrambled serial data output 53 is fed to the deserializer 56. The deserializer 56 takes the descrambled data output 53 which still comprises a serial bit stream and converts it into a parallel data output as indicated by reference 55.

The deserializer 56 uses the recovered clock signal 59 to generate a TRS DETECT signal 57 on output line 64. The TRS DETECT signal 57 is used to deserialize the serial data output 53 and also by the control circuit 50.

As shown in FIG. 4, the phase locked loop 54 has a loop filter output 66, a VCO control input port 68 and a frequency select input 70. According to the invention, the control circuit 50 is coupled to the loop filter output 66 and the VCO control and the frequency select inputs 68,70. The control circuit 50 also includes inputs for receiving the carrier detect signal 63 and the TRS detect signal 57. In another embodiment of the invention, the control circuit 50 uses a horizontal synchronization signal (see FIG. 6) instead of the TRS detect and carrier detect signals 57,63.

As will be described below, the control circuit 50 according to the invention provides correction for temperature drift in the VCO stage of the phase locked loop 54 while featuring wide tuning range control of the VCO stage. Another feature of the invention is that the control circuit 50 has a low time constant. This minimizes the effect of the control circuit 50 on the characteristics of the phase locked loop 54. As will be described, the control circuit 50 according to the invention also features a discriminator for determining whether the video signal input is a composite video signal or a component video signal.

Figure 5:
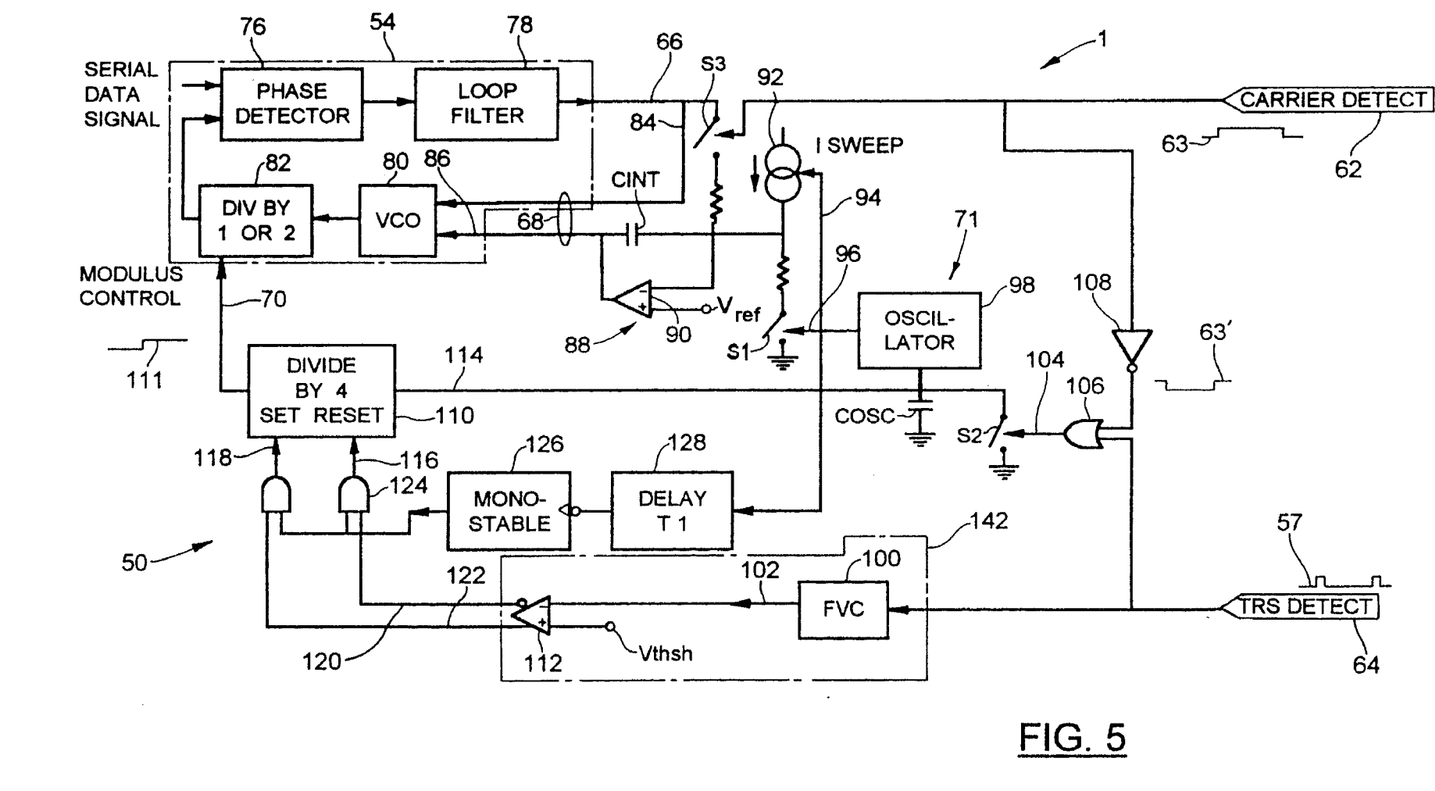
FIG. 5 is a more detailed block diagram showing the clock recovery circuit of FIG. 4.

Reference is next made to FIG. 5 which shows in more detail the control circuit 50. In FIG. 5, the corresponding elements in the FIG. 4 are indicated by the same reference numbers. According to the invention, the phase locked loop 54 comprises a phase detector 76, a loop filter 78, a voltage controlled oscillator 80 which includes a dual modulus frequency divider 82. According to the invention, the VCO 80 has both a narrow range control input 84 and a wide range control input 86 which together comprise the VCO control input port 68. Furthermore, the wide range control input 86 is coupled to the output of an integrator 88. As will be described below, the integrator 88 provides both a frequency sweeping function and an automatic fine tuning function.

Referring still to FIG. 5, the integrator 88 comprises an operational amplifier 90. The non-inverting input of the op amp 90 is tied to a reference voltage $V_{ref}$ and the inverting input is coupled to the output of the op amp 90 through an integrating capacitor $C_{int}$. The inverting input of the op amp 90 is also coupled to the output 66 of the loop filter 78 through a switch $S_3$. The control input of the switch $S_3$ is connected to a control signal, the carrier detect signal 63 on output 62 (FIG. 4). The inverting input of the op amp 90 is also coupled to a current source 92 and to a switch $S_1$. The current source 92 produces a constant current $I_{sweep}$. The current source 92 includes a control input 94 which is coupled to a timing reference control stage indicated generally by reference 71. The switch $S_1$ also has a control terminal 96 which is coupled to the timing reference control stage 71.

The control stage 71 comprises an oscillator 98 and a control logic for the TRS DETECT and carrier detect signals 57,63. The function of the oscillator 98 is to control the operation of the tuner (i.e. integrator 88) and frequency sweeper (i.e. current source 92) as will be described.

The TRS DETECT signal 57 is also coupled to a composite/component video signal detector 142. The video signal detector 142 is a feature of the invention which is used to discriminate between composite and component video signals as will be described below. The video signal detector 142 comprises a frequency to voltage converter (i.e. FVC) 100 and a comparator 112. The function of the FVC 100 is to provide a voltage signal on output 102 which corresponds to the frequency of the input signal 11. The voltage signal on output 102 is fed to the comparator 112 which compares it to a voltage threshold $V_{thsh}$ and produces an output signal which is indicative of the type of input signal 11, i.e. composite video or component video.

As shown in FIG. 5, the output of the oscillator 98 is coupled to the control input 96 of the switch $S_1$. The oscillator 98 is controlled by a capacitor $C_{osc}$ and a switch $S_2$. The switch $S_2$ has a control input 104 which is coupled to the output of a logic "OR" gate 106. The logic gate 106 has one input connected to an inverted carrier detect signal 63', which has been logically inverted through an inverter 108. The other input of the gate 104 is connected to the TRS Detect signal 57 (see FIG. 4).

The composite/component video signal detector 142 is coupled to a divide-by-four divider 110. The divider 110 produces a modulus control output signal 111 which is coupled to the frequency range select input 70 (and the dual modulus divider 82 and VCO 80) in the phase locked loop 54. The signal 111 provides the frequency select for the modulus two divider 82 in the PLL 54. The divide-by-four divider 110 in conjunction with the dual modulus divider 82 provides the center frequency range for the four standards comprising SMPTE 259M.

The divider 110 has an input 114 which is connected to the capacitor $C_{osc}$. The divider 110 also has a reset input 116 and a set input 118. The inverting input of the comparator 112 is connected to the output 102 of the frequency-to-voltage converter 100 and the non-inverting input is connected to the voltage reference $V_{thsh}$. As shown, the comparator 112 provides an inverted output 120 and a non-inverted output 122. The inverted output 120 is coupled to the reset input 116 through a logical "AND" gate 124. The other input for the AND gate 124 is provided by a delay circuit comprising a monostable 126 and a delay stage 128. The delay stage 128 produces a delay T1, which for composite/component video application is in the order of 10 milliseconds. The input of the delay stage 128 is coupled to the capacitor $C_{osc}$ and provides a "trigger" to the monostable 126 which in turn provides a "clock pulse" input to the AND gate 124.

As shown in FIG. 5, the non-inverted output 122 of the comparator 112 is coupled to the set input 118 through another AND gate 130. The non-inverted output 122 is "ANDed" with the output of the monostable 126 to set the divider 110.

Referring to FIGS. 4 and 5, the operation of the clock recovery circuit 50 according to the invention is as follows. When the carrier detect signal 63 is high and the TRS DETECT 57 signal is low, the output from the OR gate 106 is low and the switch $S_2$ is open. With the switch $S_2$ open, the oscillator 98 is enabled and the oscillator 98 will control (through the control terminal 96) the switch $S_1$ causing the capacitor $C_{int}$ to charge and discharge. The closing and opening of switch $S_1$ causes the integrator 88 to produce a "sawtooth" waveform output which is fed to the wide range control input 86. The sawtooth output from the integrator 88 has the effect of sweeping the frequency of the VCO 80. The phase locked loop 54 will "lock" to the incoming serial data signal 11 when the frequency of the VCO 80 (and the divider 82) is within the "pull-in" range of the phase locked loop 54.

When the PLL 54 locks, the digital receiver 48 generates the re-timed data 57 and recovered clock 59 signals. The descrambler 52 (and deserializer 56) will then detect the timing reference signal and produce a TRS DETECT signal 57 on the output 64. For composite and component video signals, the TRS DETECT signal 57 will go high for one serial digital clock period at a rate which is equal to the horizontal rate for composite video or twice the horizontal rate for the component video signals. When the TRS DETECT signal 57 goes high, the control input 104 to the switch $S_2$ also goes high thereby closing switch $S_2$. The switch $S_2$ will remain closed for the duration of the pulse in the TRS DETECT signal 57. With switch $S_2$ closed the capacitor $C_{osc}$ is discharged to zero volts, and when switch $S_2$ is open the oscillator 98 cannot charge the capacitor $C_{osc}$ to a high enough voltage before the switch $S_2$ closes again, and therefore the switch $S_1$ remains open and the current source 92 is disabled. With the current source 92 disabled, the integrator 88 remains in the path or loop of the wide range control 86 and provides the automatic fine tuning function to bring and keep the narrow range control input 84 for the VCO 80 at the voltage reference $V_{ref}$, i.e. the voltage level at the inverting input of the op amp 90.

Figure 6:
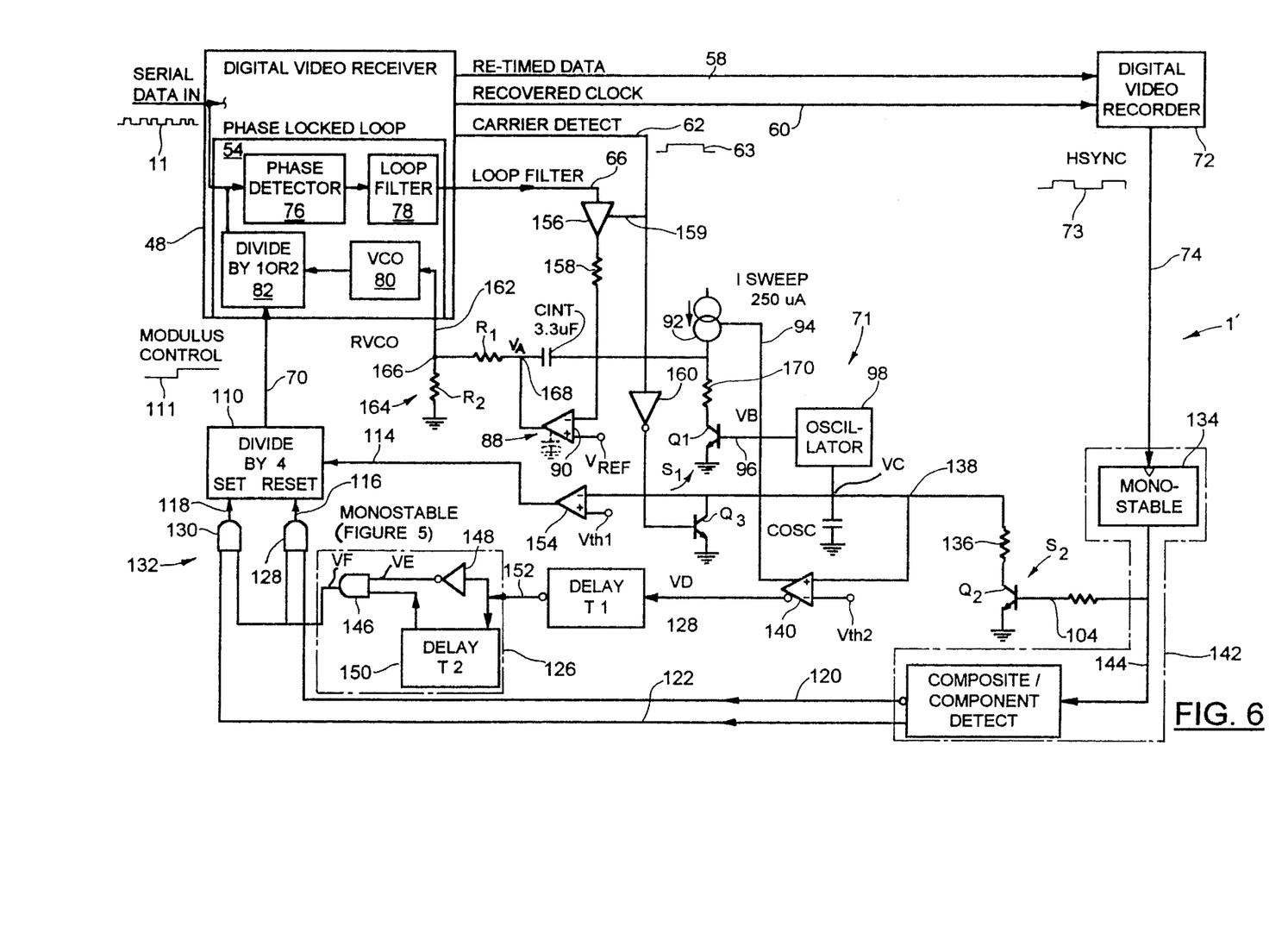
FIG. 6 is a block diagram showing another embodiment of the clock recovery circuit according to the invention for use with a digital video receiver and decoder.

Reference is next made to FIG. 6 which shows another embodiment of a control circuit according to the invention and indicated generally by reference 132. The control circuit 132 is similar to the control circuit 50 of FIG. 5. Corresponding reference numbers are used to indicate corresponding parts in FIGS. 5 and 6. In addition, values for various components are indicated next to the component, e.g. 3.3 uF for capacitor $C_{int}$.

The control circuit 132 shown in FIG. 6 is intended for use with a clock recovery circuit 1' comprising the digital receiver 48 and a digital video decoder 72. The digital receiver 48 and digital video decoder 72 can comprise the GS9000 family of components by Gennum Corporation of Burlington, Ontario, Canada. The digital decoder 72 combines the functions of the descrambler 52 and deserializer 56 (FIG. 4). The video decoder 72 produces a horizontal synchronization signal (or hsync) 73 on an output 74. The decoder 72 generates the hsync signal 73 instead of the TRS DETECT signal 57. The hsync signal 73 is a digital signal which changes state every time a timing reference signal (TRS) is detected. Thus, the frequency of the hsync signal 73 is half that of the TRS DETECT signal 57 (FIG. 5).

As shown in FIG. 6, the hsync output 74 of the decoder 72 is coupled to the trigger input of a monostable vibrator 134. In known manner, the monostable 134 provides a predetermined output pulse in response to a trigger input. As shown in FIG. 6, the trigger input of the monostable 134 is coupled to the hsync signal 73 and the output is coupled to the control terminal 104 of switch $S_2$. The switch $S_2$ is implemented using a NPN transistor $Q_2$, with the base of the transistor $Q_2$ providing the control terminal 104 for the switch $S_2$. The collector of transistor $Q_2$ is coupled to the capacitor $C_{osc}$ through a resistor 136 to form node 138. As shown in FIG. 6, the composite/component detect stage 142 is coupled to a monostable 134 which utilizes the hsync signal 73 as a trigger input. In this embodiment, the monostable 134 is part of the frequency to voltage convertor 100 (shown in FIG. 5).

Referring still to FIG. 6, the control terminal 94 of the current source 92 is now coupled to the non-inverted output of a comparator 140. The non-inverting input of the comparator 140 is connected to node 138 and is responsive to a voltage $V_c$ (i.e. the voltage of capacitor $C_{osc}$). The inverting input of the comparator 140 is connected to a voltage threshold $V_{th2}$. The inverted output of the comparator 140 is connected to the input of the delay stage 128 and provides a voltage signal $V_D$ for the delay stage 128. Whenever, the voltage $V_c$ exceeds the threshold voltage $V_{th2}$, the non-inverted output of the comparator 140 will be high and thereby enabling the current source 92, and conversely, the inverted output (i.e. voltage signal $V_D$) will be low.

Referring still to FIG. 6, the control circuit 132 includes the composite/component signal detect stage 142 which is shown as a block. The composite/component detect stage 142 has an input 144 which is coupled to the output of the monostable 134 (and the control terminal 104 of the switch $S_2$). As shown, the composite/component detect 142 includes the inverted output 120 and non-inverted output 122. The composite/component detect stage 142 now comprises the frequency-to-voltage converter 100 and comparator 112 shown in FIG. 5 and the monostable 134 shown in FIG. 6. As also shown in FIG. 6, the monostable 126 (FIG. 5) is realised with an AND logic gate 146, an inverter 148 and a delay stage 150. The delay stage 128 provides an active low output 152 (i.e. delay T1) which is fed to the inverter 148 and to the second delay stage 150. The second delay stage 150 produces a second delay period T2. The output 152 (i.e. signal $V_D$ which has been delayed for time T1 by the first delay stage 128) is inverted to produce voltage signal $V_E$ and the voltage $V_E$ is "ANDed" with the output (i.e. the output from delay stage 128 delayed a further time T2, i.e. 6 microseconds) from the second delay stage 150 to produce a voltage signal $V_F$. The voltage signal $V_F$ provides a clock pulse input to each of the AND gates 128,130 and in conjunction with the outputs 120,122 of the composite/component detect stage 142 controls the reset 116 and set 118 inputs of the divider 110. The output of the divider 110 comprises the modulus control signal 111 which is connected to the frequency select input 70 of the phase locked loop 54.

Referring again to FIG. 6, the input 114 to the divider 110 is now coupled to node 138 (i.e. voltage signal $V_c$) through a comparator 154. The inverting input of the comparator 154 is coupled to the node 138 and receives the voltage signal $V_c$. The non-inverting input, on the other hand, is coupled to a voltage threshold $V_{th1}$. It will be readily apparent that the output of the comparator 154 will be high whenever the threshold voltage $V_{th1}$ exceeds the voltage signal $V_c$.

The output 66 from the loop filter 78 is now coupled to the integrator 88 through a tri-state buffer 156. The output of the tri-state buffer 156 includes a resistor 158. The tri-state buffer 156 has a control terminal 159 which is coupled to the carrier detect output 62 from the digital receiver 48. The control terminal 159 is active high so that the output of the tri-state buffer 156 goes to a high impedance state when the carrier detect output 62 is low. The carrier detect output 62 is coupled through an inverter 160 to the base of a transistor $Q_3$. The collector of transistor $Q_3$ is coupled to the capacitor $C_{osc}$ at node 138. The function of transistor $Q_3$ is described below.

In the control circuit 132 shown in FIG. 6, the VCO 80 includes a control input 162 which is coupled to the output of the integrator 88 through a resistor $R_1$. The VCO provides a voltage level at the control input 162, i.e. node 166. A resistor $R_2$ is connected between the control input 162 and signal ground. The resistor $R_2$ sets the current for biasing (i.e. setting the frequency of the VCO 80), and the integrator 88 generates the voltage signal $V_A$ which either injects or removes current through resistor $R_1$ thereby controlling the oscillation frequency of the VCO 80. The switch $S_1$ is realised using a transistor $Q_1$. The collector of the transistor $Q_1$ is coupled to the input of the integrator 88 (i.e. the inverting input of the op amp 90) through a resistor 170. The base of the transistor $Q_1$ provides the control terminal 96 and is coupled to the output of the oscillator 98 which produces a control signal $V_B$.

The operation of the control circuit 132 will now be explained with reference to FIG. 6 and the timing diagrams in FIGS. 7 and 8.

In operation, every other time a timing reference signal (TRS) is detected, a positive-edge transition occurs in the hsync signal 73. (This follows because the state of the hsync signal 73 changes every time the timing reference signal is detected by the digital video decoder 72.) This positive-edge transition in the hsync signal 73 triggers the monostable 134 which turns on the transistor $Q_2$. Turning on transistor $Q_2$ causes the capacitor $C_{osc}$ to discharge which will shut-off the oscillator 98.

Figure 7:
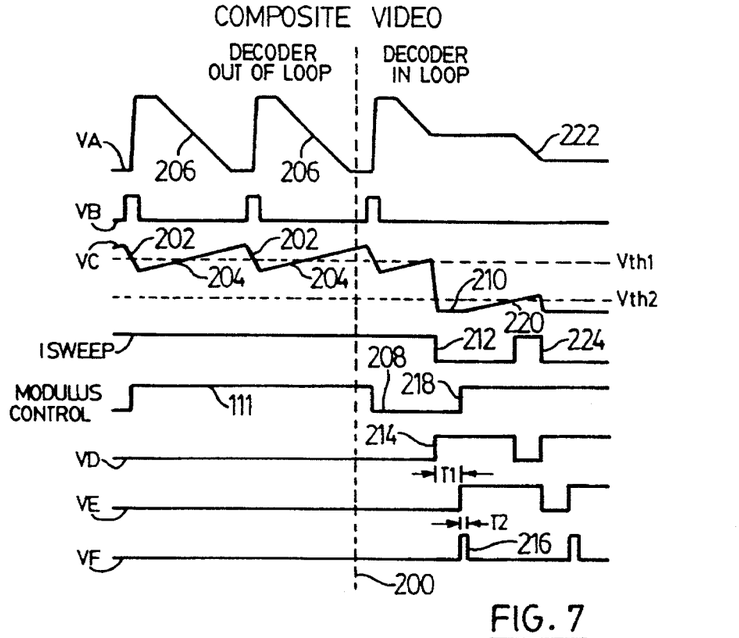
FIG. 7 is a timing diagram showing the relationship between a composite video signal and various timing signals generated by the clock recovery circuit of FIG. 6.

Reference is made to FIG. 7 which provides a timing diagram for various signals shown in FIG. 6 when the serial input signal 11 comprises composite video. The timing diagram shown in FIG. 7 is divided by a broken line 200 into two portions. The left-hand side illustrates the situation where the video decoder 72 is "out of the loop", i.e. no hsync signal 73 is generated. The right-hand side, on the other, shows the relationship between the signals when the video decoder 72 is in the loop, i.e. hsync 73 is detected.

Consider first the situation when the video decoder 72 is out of the loop, i.e. the left-hand portion of FIG. 7. In operation, when the digital video decoder 72 is out of the loop, there will be no hsync signal 73 present to shut off the oscillator 72. The oscillator 72 is designed to have a ten percent duty cycle, so that the oscillator 72 will discharge the capacitor $C_{osc}$ with nine times the current than it charges the capacitor $C_{osc}$. This is illustrated in FIG. 7 by the steep negative slope of the voltage signal $V_C$ as indicated by reference 202. During the charging phase (indicated by reference 204), the voltage signal $V_C$ at node 138 (FIG. 6) will be rising and the transistor $Q_1$ will be off. When transistor $Q_1$ is off, the current $I_{sweep}$ discharges the capacitor $C_{int}$, i.e. the voltage $V_A$ taken at node 168 is decreasing as indicated by reference 206. This results in the output, i.e. voltage $V_A$, of the integrator 88 being a sawtooth waveform as shown in FIG. 7. Because the voltage signal $V_A$ is coupled to the control input 162, the frequency of the VCO 80 will increase or "sweep". The voltage $V_C$ is compared to a threshold voltage $V_{th1}$ by a comparator 154. The output of the comparator 154 is connected to the input 114 of the divide-by-four stage 110 which generates a modulus control signal 111.

Referring back to FIG. 6, the comparator 140 compares the voltage signal $V_C$ (i.e. the voltage level on capacitor $C_{osc}$) to another voltage threshold $V_{th2}$. The comparator 140 produces the output voltage signal $V_D$ when the voltage threshold $V_{th2}$ exceeds the voltage $V_C$. The non-inverted voltage signal $V_D$ from the comparator 140 is connected to the control terminal 94 of the current source 92. The current source 92 is enabled or on while the voltage signal $V_C$ exceeds the threshold voltage $V_{th2}$ (see [sweep in FIG. 7). The voltage signal $V_D$ is used to generate a clock pulse $V_F$ for the divider 110.

Consider next the situation when the decoder 72 is in the loop, i.e. the right hand side of the FIG. 7, and the modulus control signal 111 is low as indicated by reference 208. Assuming that the phase locked loop 54 (in the digital receiver 48) is able to lock to a composite video signal, i.e. the serial input signal, with the frequency-divider modulus of the divider 82 set to 1, the frequency of the VCO 80 will sweep until lock is achieved. When lock is achieved, the video decoder 72 produces the hsync signal 73 which toggles every time a TRS is detected. As described above, each positive transition in hsync 73 will turn on transistor $Q_2$ thereby continuously discharging the capacitor $C_{osc}$ to bring the voltage signal $V_C$ below the threshold voltage $V_{th2}$ as indicated by reference 210.

Referring to FIG. 7 (and FIG. 6), when the voltage signal $V_C$ drops below the threshold voltage $V_{th2}$, the non-inverted output of the comparator 140 goes low and shuts off the current source 92 (and the current $I_{sweep}$ indicated by reference 212). The inverted output of comparator 140, on the other hand, goes high and begins the delay period T1 indicated by reference 214. Once the phase locked loop 54 has locked, the integrator 88 provides the automatic fine tuning function which maintains the voltage signal $V_A$ relatively constant (since the charge in the capacitor $C_{int}$ remains unchanged because current $I_{sweep}$ is off). In the composite/component detect stage 142 and monostable 134, the frequency of the hsync signal 73 is measured and converted to a voltage signal which is compared to a threshold voltage. For a composite video signal, non-inverted output 122 of the detect stage 142 will remain high, and after the delay period T2, the signal $V_F$ will clock the output 122 to set the output (i.e. modulus control signal 111) of the divider 110 high as indicated by references 216 and 218 in FIG. 7.

Once the modulus control signal 111 goes high (reference 218 in FIG. 7), the phase locked loop 54 will lose lock. When the PLL 54 loses lock, the hsync signal 73 stops toggling and the capacitor $C_{osc}$ will start charging causing the voltage signal $V_C$ to rise. This is indicated by reference 220 in FIG. 7. Once the voltage signal $V_C$ rises above the threshold voltage $V_{th2}$, the current source 92 will turn on and the voltage signal $V_A$ will begin to sweep the frequency of the VCO 80 as indicated by reference 222 in FIG. 7. Because the modulus control signal 111 is high, the modulus for frequency divider 110 is set to 2. Thus, when the frequency of the VCO 80 reaches twice its previous value, the phase locked loop 54 will lock. When the PLL 54 locks, the hsync signal 73 will again begin to toggle thereby shutting off the oscillator 98 and the constant current $I_{sweep}$ as indicated by reference 224 in FIG. 7. After the delay period T1 generated by the delay stage 128, the output 122 from the composite/component detect stage 142 is clocked to set the divide-by-four divider 110 and the modulus control signal 111 will remain unchanged, i.e. high, as shown in FIG. 7.

Figure 8:
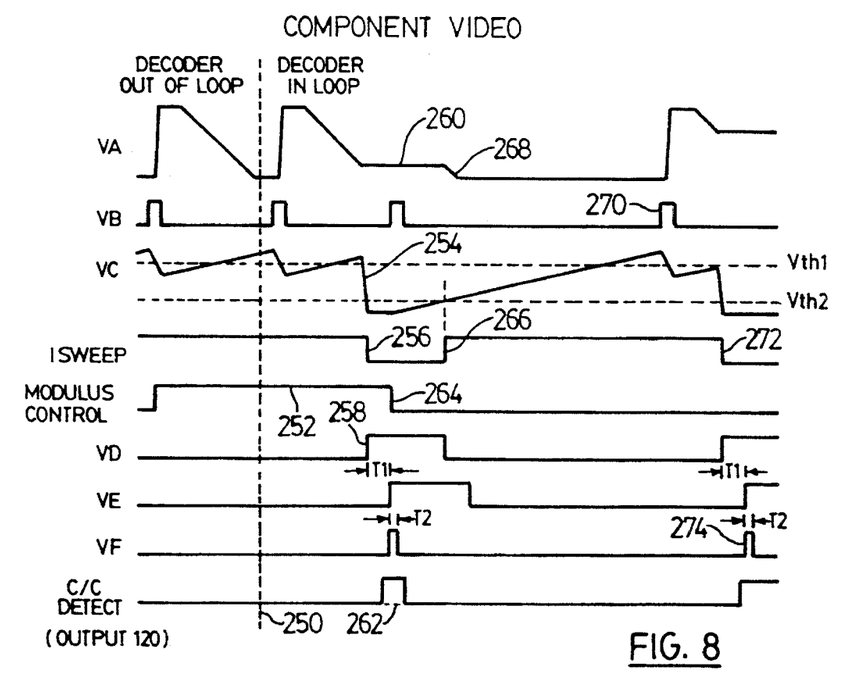
FIG. 8 is a timing diagram showing the relationship between a component video signal and various timing signals generated by the clock recovery circuit of FIG. 6.

Reference is next made to FIG. 8 which is a timing diagram for various signals shown in FIG. 6 when the serial input signal 11 (FIG. 6) comprises component video. Like for FIG. 7, the timing diagram shown in FIG. 8 is divided by a broken line 250 into two portions. The left-hand side illustrates the situation where the video decoder 72 is "out of the loop", i.e. no hsync signal 73 is generated. The right-hand side, on the other, shows the relationship between the signals when video decoder 72 is in the loop, i.e. hsync 73 is detected.

Consider first the situation when the decoder 72 is in the loop and the modulus control signal 111 is high as indicated by reference 252 in FIG. 8. Assuming that the phase locked loop 54 and the digital receiver 48 are able to lock to the component video signal (i.e. serial input signal) with the frequency-divider modulus set at 2 (corresponding to a modulus control signal 111 which is high), the frequency of the VCO 80 will sweep until lock is achieved. When lock is achieved, the hsync signal 73 will begin to toggle causing the transistor $Q_2$ to turn on. With transistor $Q_2$ on, the capacitor $C_{osc}$ will discharge thereby bringing the voltage signal $V_C$ below the threshold voltage $V_{th2}$ as indicated by reference 254 in FIG. 8. This in turn will shut off the current source 92 (and the current $I_{sweep}$) and the comparator 140 will produce output signal $V_D$ which will be delayed by the delay period $T_1$ as indicated by references 256 and 258 in FIG. 8. Because the phase locked loop 54 has locked, the integrator 88 will control the voltage signal $V_A$ within a narrow range (since the current source 92 is off as indicated by reference 260).

Referring back to FIG. 6, when the hsync signal 73 starts to toggle, the composite/component detect stage 142 will convert the frequency of the hsync signal 73 to a voltage which is compared to a threshold voltage $V_{thsh}$ (FIG. 5) to determine if the frequency of the hsync signal 73 signifies a composite video signal or a component video signal. If the serial input signal is component video, the output 122 of the composite/component detect stage 142 goes low and the inverted output 120 goes high as indicated by reference 262 in FIG. 8. The output 122 is clocked to the reset input 116 by the voltage pulse $V_F$ which is generated from voltage signal $V_E$ after the delay period $T_1$. This causes the divider 110 to reset the modulus control signal 111 as indicated by reference 264 in FIG. 8.

Once the modulus control signal 111 goes low (as indicated by reference 264 in FIG. 8), the phase locked loop 54 will lose lock. When the PLL 54 loses lock, the hsync signal 73 will stop toggling causing the switch $S_2$ to open and the capacitor $C_{osc}$ will charge. As the capacitor $C_{osc}$ charges the voltage signal $V_C$ at node 138 will also rise. Once the voltage signal $V_C$ rises above the voltage threshold $V_{th2}$, the comparator 140 enables the current source 92 and the current $I_{sweep}$ is turned on as indicated by reference 266 in FIG. 8. As the current $I_{sweep}$ charges the capacitor $C_{int}$, the output voltage $V_A$ of the integrator 88 will decrease until it reaches a lower limit (reference 268 in FIG. 8).

The frequency sweep will begin after waiting for the oscillator 98 to turn on the transistor $Q_1$ as indicated by reference 270 in FIG. 8. Because the frequency-divider modulus for the divider 82 (in the PLL 54) is set to one (corresponding to the modulus control signal 111 being low), the phase locked loop 54 will lock when the frequency of the VCO 80 reaches half what it was before. Once lock is achieved, the hsync signal 73 will again begin to toggle thereby shutting off the oscillator 98 and the current source $I_{sweep}$ as indicated by reference 272 in FIG. 8. After the delay period $T_1$, the output from the composite/component detect stage 42 will be clocked by the voltage signal $V_F$ (reference 274 in FIG. 8) to reset the divide-by-four stage 110, and therefore the modulus control signal 111 remains unchanged, i.e. low.

As described above, the frequency-divider modulus control of the divider 82 is achieved by dividing the oscillator 98 output by four. In normal operation, the phase locked loop 54 will lock when the modulus control signal 111 is in the correct state. However, there could be an instance where the phase locked loop 54 locks with the modulus control signal 111 in the wrong state. To ensure that the modulus control signal 111 is set "high" for composite video and "low" for component video, the composite/component detect stage 142 (FIG. 6) includes the monostable 134 and the frequency-to-voltage converter (FVC) 100 and comparator 112 shown in FIG. 5.

Referring back to FIG. 5, the frequency-to-voltage converter (FVC) 100 measures the frequency of the TRS DETECT signal 57 and converts it to a voltage signal which is compared to the voltage threshold $V_{thsh}$. The output of the comparator 112 is sampled by operation of the monostable 126 after the delay period T1, beginning from the time the TRS DETECT signal 57 first goes high. This delay compensates for the time constant of the frequency-to-voltage converter 100 and would therefore be selected according to the characteristics of the FVC 100. If the frequency of the TRS DETECT signal 57 corresponds to composite video (i.e. 15.734 kHz or 15.625 kHz), then the output 122 of the comparator 112 will be high. As described above, the monostable 126 will clock the output of the comparator 112 to the divider 110 after the delay period T1. If the output 122 of the comparator 112 is high, then this will "set" the divider 110 and the modulus control signal 111 will go "high". Conversely, if the frequency of the TRS DETECT signal 57 corresponds to component video, the output, of the divide-by-four stage or divider 110 will be reset and the modulus control signal 111 will go "low".

It is now apparent that in either event, if the FVC 100 produces any change in the modulus control signal 111, the phase locked loop 54 will immediately lose lock causing the TRS DETECT signal 57 to go low. This results in the oscillator 98 beginning to oscillate causing the frequency to sweep. Once the frequency starts to sweep, the phase locked loop 54 will lock with the modulus control signal 111 in the proper state before the divider 110 can change its state, since two complete sweeps would be required to do so.

Referring still to FIG. 5, if the serial data input signal 11 is interrupted, the carrier detect signal 63 (on output 62) will go low. This causes the switch $S_3$ to open and disable the automatic fine tuning function of the integrator 88. The "low" carrier detect signal 63 will also disable the oscillator 98 by closing the switch $S_2$. Because the inverted carrier detect signal 63 is logically OR'ed", the oscillator 98 will remain off even though the TRS DETECT signal 57 remains low. This results in the charge on capacitor $C_{int}$ remaining constant, and the wide range control voltage, i.e. voltage $V_A$, which is fed to the voltage controlled oscillator 80 on control line 86 is held in memory. This feature gives the phase locked loop 54 the capability to lock without frequency sweeping when the data stream, i.e. serial data signal 11, returns.

This feature of the invention is also implemented in the clock recovery circuit 132 shown in FIG. 6. If the serial data stream in the input signal 11 is interrupted, then the carrier detect signal 63 will go low and by the inverter 160 cause transistor $Q_3$ to turn on. When transistor $Q_3$ turns on, the capacitor $C_{osc}$ will discharge and the oscillator 98 will turn off. This causes the transistor $Q_1$ to turn off and the current source 92 is disabled and the current $I_{sweep}$ also turns off. As shown in FIG. 6, the carrier detect signal 63 is also used to enable the tri-state buffer 156 which is coupled between the loop filter output 66 and the input to the integrator 88. Since the buffer 156 has an active-high enable 159, the buffer 156 is disabled with its output going to a high impedance state when the carrier detect signal 63 goes low. In the high impedance state, the buffer 156 neither sources or sinks current. Thus when the carrier detect signal 63 goes low, the charge on the capacitor $C_{int}$ is held constant and the voltage controlled oscillator 80 (and the digital video receiver 48) will remain tuned to the correct frequency so that the phase locked loop 54 will lock without frequency sweeping when the serial data signal 11 returns.

Although various preferred embodiments of the present invention have been described in detail, it will be appreciated by those skilled in the art, that variations may be made thereto without departing from the spirit of the invention or the scope of the amended claims.

I claim:

1. A control circuit for use with a phase locked loop having an input port for an input signal and a voltage controlled oscillator which includes a frequency divider having a frequency select input port for selecting the modulus and the voltage controlled oscillator having a control port for controlling the frequency of the voltage controlled oscillator, said control circuit comprising:

(a) a tuning stage coupled to the control port of the voltage controlled oscillator, said tuning stage including means for producing a frequency control signal at said control port for controlling the frequency of the voltage controlled oscillator;

(b) a frequency sweeping stage coupled to said tuning stage and including means for varying the frequency of the voltage controlled oscillator and means for locking the frequency of the voltage controlled oscillator to the input signal; and (c) a control stage coupled to said frequency sweeping stage and having an input for receiving a timing reference signal recovered from the input signal and means responsive to said timing reference signal for controlling the operation of said frequency sweeping stage and said tuning stage.

2. The control circuit as claimed in claim 1, further including a modulus control stage having an output coupled to the frequency select input of the divider and including a frequency detector having an input for receiving said timing reference signal and detector means for detecting the frequency of said timing reference signal and discriminator means coupled to said detector means for discriminating between a composite video signal and a component video signal and producing a modulus control signal indicative of the video signal.

3. The control circuit as claimed in claim 1, wherein said means for producing a frequency control signal comprises an integrator having an input coupled to the output of a loop filter for receiving a loop filter output signal and an output coupled to the control port of the voltage controlled oscillator, said integrator including means for integrating said loop filter output signal to produce said frequency control signal on said output.

4. The control circuit as claimed in claim 3, wherein said integrator includes a second input connected to a reference level and said means for integrating is responsive to said reference level for producing a frequency control signal within range of said reference level.

5. The control circuit as claimed in claim 1, wherein said means for varying the frequency comprises a signal source coupled to said means for producing a frequency control signal, said signal source including means for generating a frequency sweep signal for varying said frequency control signal.

* * * * *